US 8,058,678 B2

(12) United States Patent
Kim et al.

(10) Patent No.: US 8,058,678 B2
(45) Date of Patent: Nov. 15, 2011

(54) SEMICONDUCTOR MEMORY DEVICE INCLUDING A CYLINDER TYPE STORAGE NODE AND A METHOD OF FABRICATING THE SAME

(75) Inventors: Gil-Sub Kim, Suwon-si (KR); Won-Mo Park, Seongnam-si (KR); Seong-Ho Kim, Seoul (KR); Dong-Kwan Yang, Yongin-si (KR)

(73) Assignee: Samsunge Electronics Co., Ltd., Suwon-Si (KR)

( * ) Notice: Subject to any disclaimer, the term of this patent is extended or adjusted under 35 U.S.C. 154(b) by 122 days.

(21) Appl. No.: 12/537,461

(22) Filed: Aug. 7, 2009

(65) Prior Publication Data
US 2010/0187588 A1   Jul. 29, 2010

(30) Foreign Application Priority Data

Jan. 29, 2009   (KR) .................... 10-2009-0006979

(51) Int. Cl.
*H01L 27/108* (2006.01)
(52) U.S. Cl. ................ 257/296; 257/306; 257/E27.084; 257/E27.088
(58) Field of Classification Search .................. 257/306, 257/296, E27.084, E27.088
See application file for complete search history.

(56) References Cited

U.S. PATENT DOCUMENTS

| | | | | |
|---|---|---|---|---|
| 6,074,911 A * | 6/2000 | Wu et al. ........................ | 438/253 |
| 6,207,988 B1 * | 3/2001 | Tsuboi ........................ | 257/309 |
| 6,221,775 B1 * | 4/2001 | Ference et al. ................ | 438/691 |
| 6,239,022 B1 * | 5/2001 | Seo et al. ..................... | 438/629 |
| 6,258,691 B1 * | 7/2001 | Kim .............................. | 438/398 |
| 6,423,608 B1 * | 7/2002 | Kim .............................. | 438/396 |
| 6,566,241 B2 * | 5/2003 | Chun ........................... | 438/618 |
| 6,576,941 B1 * | 6/2003 | Lee et al. ...................... | 257/295 |
| 6,576,947 B1 * | 6/2003 | Kim .............................. | 257/309 |
| 6,734,486 B2 * | 5/2004 | Okumura ...................... | 257/303 |
| 6,762,110 B1 * | 7/2004 | Masuda ........................ | 438/396 |
| 6,914,336 B2 * | 7/2005 | Matsuki et al. ............... | 257/769 |
| 7,074,670 B2 | 7/2006 | Park et al. | |
| 7,410,866 B2 * | 8/2008 | Sun et al. ...................... | 438/254 |
| 7,482,652 B1 * | 1/2009 | Yang ............................ | 257/314 |
| 7,820,507 B2 * | 10/2010 | Choi ............................ | 438/253 |
| 2002/0146899 A1 * | 10/2002 | Chun ........................... | 438/618 |
| 2002/0173096 A1 * | 11/2002 | Okudaira ...................... | 438/253 |
| 2003/0089993 A1 * | 5/2003 | Yoshizawa et al. ........... | 257/763 |
| 2005/0272218 A1 * | 12/2005 | Park et al. ..................... | 438/386 |
| 2007/0059846 A1 * | 3/2007 | Kobayashi et al. ............... | 438/3 |
| 2007/0170488 A1 * | 7/2007 | Ryu et al. ..................... | 257/308 |
| 2009/0008744 A1 * | 1/2009 | Nishi ............................ | 257/532 |
| 2009/0072291 A1 * | 3/2009 | Takaishi ....................... | 257/306 |
| 2009/0114970 A1 * | 5/2009 | De-Jonghe et al. ........... | 257/306 |
| 2009/0289326 A1 * | 11/2009 | Park et al. ..................... | 257/532 |

FOREIGN PATENT DOCUMENTS

| | | |
|---|---|---|
| JP | 2005-167188 | 6/2005 |
| KR | 1020040000007 | 1/2004 |

* cited by examiner

*Primary Examiner* — Evan Pert
(74) *Attorney, Agent, or Firm* — F. Chau & Associates, LLC (57) ABSTRACT

Provided is a semiconductor memory device including cylinder type storage nodes and a method of fabricating the semiconductor memory device. The semiconductor memory device includes: a semiconductor substrate including switching devices; a recessed insulating layer including storage contact plugs therein, wherein the storage contact plugs are electrically connected to the switching devices and the recessed insulating layer exposes at least some portions of upper surfaces and side surfaces of the storage contact plugs. The semiconductor device further includes cylinder type storage nodes each having a lower electrode. The lower electrode contacting the at least some portions of the exposed upper surfaces and side surfaces of the storage node contact plugs.

11 Claims, 13 Drawing Sheets

SEMICONDUCTOR MEMORY DEVICE INCLUDING A CYLINDER TYPE STORAGE NODE AND A METHOD OF FABRICATING THE SAME

CROSS-REFERENCE TO RELATED APPLICATIONS

This application claims priority to Korean Patent Application No. 10-2009-0006979, filed on Jan. 29, 2009, the disclosure of which is hereby incorporated by reference herein in its entirety.

BACKGROUND (i) Technical Field

The present disclosure relates to a semiconductor memory device and to a method of fabricating the same, and more particularly, to a semiconductor memory device including a cylinder type storage node and to a method of fabricating the semiconductor memory device.

(ii) Description of the Related Art

A memory cell of a direct random access memory (DRAM) among semiconductor memory devices may include a field effect transistor as a switching device for controlling read/write operations, and a capacitor for storing information. As the scale of the DRAM has been reduced, the area occupied by the capacitor of the memory cell has been continuously decreased. To ensure a sufficient effective capacity despite the reduction of cell area, a concave type or a cylinder type storage node having a three-dimensional capacitor shape has been suggested. The cylinder type storage node is widely used in DRAM in association with a capacitor over bit line (COB) structure, in which the capacitor is formed on a bit line.

The cylinder type storage node may be required to have a height of about 2 μm or higher to obtain an effective capacity of about 25 fF or greater per unit memory cell in the case of one cylindrical storage node (OCS) structure with a design rule of about 70 nm. As the cylinder type storage node has a very large aspect ratio, the cylinder type storage node may be structurally unstable. The unstable structure of the cylinder type storage node may cause defects such as, for example, slanting or lift off of the cylinder type storage node, which may cause a twin bit error or a multi-bit error during the operation of the DRAM.

In general, to ensure the mechanical stability of the cylinder type storage node which has a large aspect ratio, an etch stop layer may be formed under a lower electrode of the cylinder type storage node for supporting the cylinder type storage node. However, as the aspect ratio of the cylinder type storage node gradually increases, there may be a limit in providing the cylinder type storage node with sufficient mechanical stability by using the etch stop layer. In addition, when an etching process is performed to form a contact hole which exposes a storage node contact plug in the etch stop layer, it may be difficult to control critical dimensions (CD) on a lower portion of the cylinder type storage node due to skew of an etched surface of the etch stop layer.

SUMMARY

Exemplary embodiments of the present invention may provide a semiconductor memory device that may ensure a sufficient mechanical stability of a cylinder type storage node when increasing an aspect ratio of the cylinder type storage node according to a continuous scaling down of the semiconductor memory device, and moreover, which may ensure a sufficient critical dimension (CD) of the storage node and required electrical properties.

In accordance with an exemplary embodiment of the present invention, a semiconductor memory device is provided. The semiconductor memory device includes a semiconductor substrate including switching devices, a recessed insulating layer including storage contact plugs therein, wherein the storage contact plugs are electrically connected to the switching devices and the recessed insulating layer exposes at least some portions of upper surfaces and side surfaces of the storage contact plugs. The semiconductor memory device further includes cylinder type storage nodes each having a lower electrode. The lower electrode contacting the at least some portions of the exposed upper surfaces and side surfaces of the storage node contact plugs.

In some exemplary embodiments, an inner wall of a dielectric layer deposited on the lower electrode of the cylinder type storage nodes may define a void region around the exposed side surface of the storage node contact plugs. In addition, the storage node contact plugs and the recessed insulating layer have an etch selectivity therebetween. The lower electrode of the cylinder type storage nodes may have an unsmooth surface morphology.

Exemplary embodiments of the present invention may also provide other semiconductor memory devices. In accordance with an exemplary embodiment of the present invention, a semiconductor memory device is provided. The semiconductor device includes a semiconductor substrate including transistors, bit lines formed on the semiconductor substrate and electrically connected to drains of the transistors. In addition, the semiconductor memory device further includes a first insulating layer formed between the bit lines and including storage node contact plugs therein, wherein the storage node contact plugs are electrically connected to sources of the transistors and the first insulating layer is recessed so as to expose at least some portions of upper surfaces and side surfaces of the storage node contact plugs. The semiconductor memory device further includes cylinder type storage nodes each having a lower electrode which contacts at least a portion of the exposed upper surfaces and side surfaces of the storage node contact plugs.

In some exemplary embodiments, the first insulating layer may include first spacer layers which are formed on side walls of the bit lines. The storage node contact plugs may be self-aligned between the bit lines by the first spacer layers.

In some exemplary embodiments, the bit lines include bit line conductive layers and second spacer layers formed on side walls of the bit line conductive layers, and the first spacer layers and the second spacer layers have an etch selectivity therebetween.

In some exemplary embodiments, at least a portion of the lower electrode of each of the cylinder type storage nodes may be supported by a contact with the side wall of the bit lines. In addition, at least a portion of the lower electrode of each of the cylinder type storage nodes may be supported by a contact with a side wall of a second insulating layer formed between the bit lines.

Exemplary embodiments of present invention may also provide various embodiments of methods of fabricating a semiconductor memory device with simple fabrication processes.

In accordance with another exemplary embodiment of the present invention, a method of fabricating a semiconductor memory device including cylinder type storage nodes is provided. The method includes forming switching devices on a semiconductor substrate; forming an insulating layer on the switching devices, forming storage node contact plugs in the insulating layer, wherein the storage node contact plugs are electrically connected to the switching devices. The method further includes recessing a portion of the insulating layer around the storage node contact plugs so as to expose at least some portions of upper surfaces and side surfaces of the storage node contact plugs and forming lower electrodes of the cylinder type storage nodes so that the lower electrodes contact at least some portions of the exposed uppers and side surfaces of the storage node contact plugs.

In some embodiments, after forming the lower electrodes of the cylinder type storage nodes, the method further includes: stacking a dielectric layer on the lower electrodes, wherein an inner wall of the dielectric layer defines void regions around the exposed side surfaces of the storage contact plugs.

In accordance with yet another exemplary embodiment of the present invention, a method of fabricating a semiconductor memory device including cylinder type storage nodes is provided. The method includes forming transistors on a semiconductor substrate, forming bit lines, which are electrically connected to drains of the transistors, on the semiconductor substrate. The method further includes forming an insulating layer filling spaces between the bit lines, forming opening regions for electrically connecting to sources of the transistors in the insulating layer, forming contact plug spacer layers on side walls of the opening regions for defining holes, forming storage node contact plugs which are filled in the holes, forming a mold layer on the semiconductor layer, forming through holes in the mold layer for exposing the contact plug spacer layers and the storage node contact plugs, recessing the contact plug spacer layers which are exposed through the through holes so as to expose upper surfaces and at least some portions of side surfaces of the storage node contact plugs, and forming lower electrodes contacting the exposed upper and at least some portions of the side surfaces of the storage node contact plugs.

In some embodiments, the exposing of the upper surfaces and at least some portions of the storage node contact plugs includes excessively etching the exposed contact plug spacer layers next to the forming of the through holes.

BRIEF DESCRIPTION OF THE DRAWINGS

Exemplary embodiments of the present invention can be understood in more detail from the following description taken in conjunction with the accompanying drawings in which.

DETAILED DESCRIPTION OF THE EXEMPLARY EMBODIMENTS

Exemplary embodiments of the present invention will be described with reference to accompanying drawings.

The example embodiments will now be described more fully with reference to the accompanying drawings. The invention may, however, be embodied in many different forms and should not be construed as being limited to the exemplary embodiments set forth herein. Like reference numerals refer to like elements.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiment.

Hereinafter, exemplary embodiments of the present invention will be described with reference to accompanying drawings schematically illustrating the embodiments. In the drawings, for example, illustrated shapes may be deformed according to fabrication technology and/or tolerances. Therefore, the exemplary embodiments of the present invention are not limited to certain shapes illustrated in the present specification, and may include modifications of shapes caused in fabrication processes.

Figure 1:
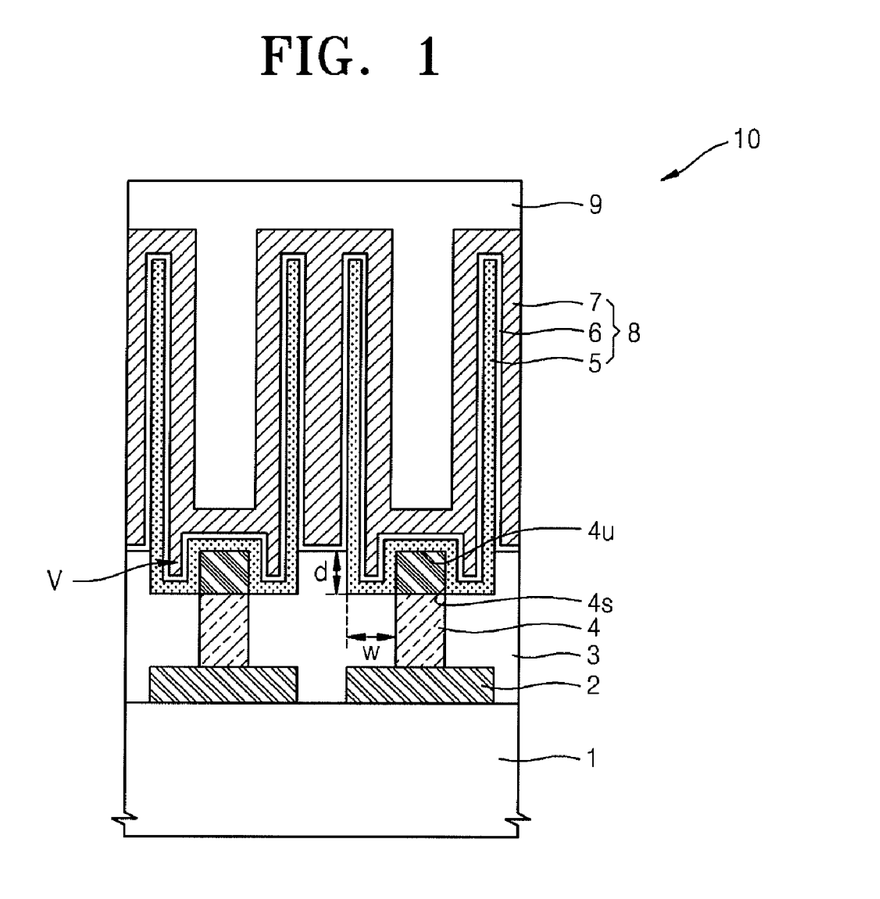
FIG. 1 is a cross-sectional view of a semiconductor memory device including a cylinder type storage node according to an exemplary embodiment of the present invention.

FIG. 1 is a cross-sectional view of a semiconductor memory device 10 including a cylinder type storage node 8 according to an embodiment of the present invention.

Referring to FIG. 1, the semiconductor memory device 10 includes a switching device 2 and the cylinder type storage node 8 which is electrically connected to the switching device 2. The switching device 2 may be formed on a semiconductor substrate 1. The switching device 2 may be, for example, a field effect transistor, for implementing a 1T-1C memory cell. In the field effect transistor, the length and the shape of a channel, or the shape and the concentration of an impurity region may be appropriately selected to prevent or reduce a short channel effect (SCE) and characteristics of leakage current.

However, the switching device 2 is not limited to the field effect transistor. For example, the switching device 2 may be formed of two or more coupled transistors that operate in a non-destructive read mode. Also, the switching device 2 may be, for example, a graphene or a nano switching device.

The cylinder type storage node 8 may include a lower electrode 5, an upper electrode 7, and a dielectric layer 6 between the lower and upper electrodes 5 and 7. The lower electrode 5 of the cylinder type storage node 8 may be electrically connected to the switching device 2 via a storage node contact plug 4 formed in the insulating layer 3. However, embodiments of the present invention are not limited to the above example. For example, another insulating layer may be disposed between the insulating layer 3 and the switching device 2, and another contact member may be disposed between the switching device 2 and the storage node contact plug 4.

As denoted by hatched line, an upper portion of the storage node contact plug 4 which contacts the lower electrode 5 of the cylinder type storage node 8 may be exposed over a surface of the insulating layer 3. A portion of the insulating layer 3 (hereinafter, referred to as a recess portion, R of FIG. 2A) may be recessed by a predetermined width w and a predetermined depth d. Thus, the upper portion of the storage node contact plug 4 can protrude over the surface of the recessed insulating layer 3. Then, an outer wall of the lower electrode 5 of the cylinder type storage node 8 may contact a side surface 4s of the storage node contact plug 4, as well as an exposed upper surface 4u of the storage node contact plug 4.

When comparing the cylinder type storage node according to the embodiments of the present invention with the conventional cylinder type storage node which is supported only by an upper surface of the storage node contact plug, the lower electrode 5 of the cylinder type storage node 8 of embodiments of the present invention may ensure additional mechanical stability due to the attachment to the side surface 4s of the storage node contact plug 4. In addition, an outer wall of the lower electrode 5 contacts the surface of the recessed portion R, as well as the storage node contact plug 4, and thus, the lower electrode 5 may be more mechanically supported. In addition, the increased contact area between the lower electrode 5 and the storage node contact plug 4 due to the recess portion R may decrease the contact resistance.

In some embodiments, the width w of the recess portion R of the insulating layer 3 may be large enough for an inner wall of the dielectric layer 6 disposed on the lower electrode 5 of the cylinder type storage node 8 to define a void region V adjacent to the exposed side surface 4s of the storage node contact plug 4. For example, as shown in FIG. 1, the width w of the recess portion R may be greater than twice the sum of thicknesses of the lower electrode 5 and the dielectric layer 6. The void region V may increase an electrode area of the cylinder type storage node 8 so as to increase a charging capacity of the cylinder type storage node 8.

FIGS. 2A through 2D are cross-sectional views illustrating processes of fabricating the cylinder type storage node 8 illustrated in FIG. 1.

Figure 2A:
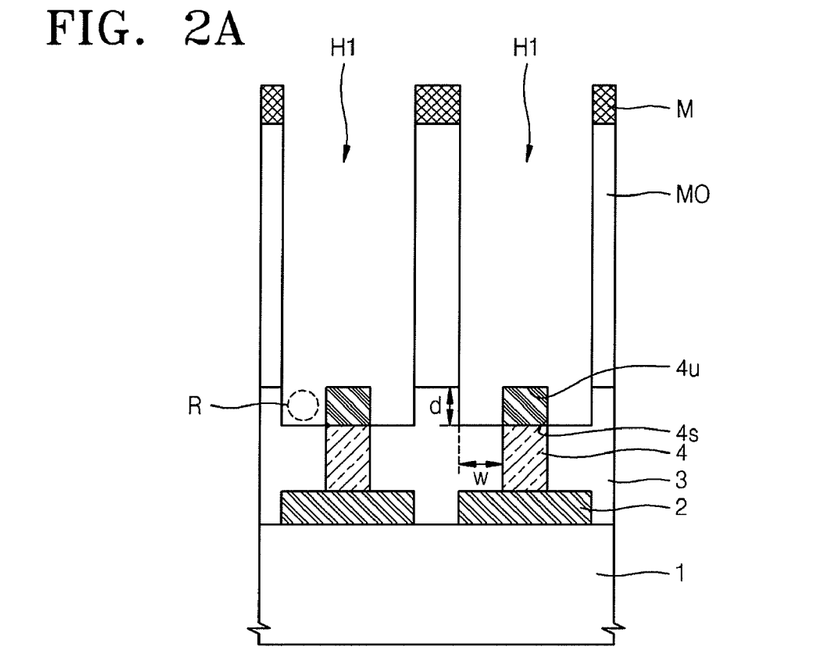
FIGS. 2A through 2D are cross-sectional views illustrating processes of fabricating the cylinder type storage node illustrated in FIG. 1.

Referring to FIG. 2A, to form the cylinder type storage node 8 in a three-dimensional shape, the insulating layer 3 may be formed on the switching device 2. Then, a contact hole which exposes a terminal of the switching device 2 may be formed in the insulating layer by using, for example, a photolithography process and an etching process. Subsequently, the contact hole may be filled with a conductive material and a planarization process may be performed to form the storage node contact plug 4 contacting the switching device 2.

After forming the storage node contact plug 4 in the insulating layer 3, a mold layer MO may be formed on the insulating layer 3 to have the same height as the cylinder type storage node 8. The mold layer MO may be formed of, for example, a silicon oxide layer which may be readily wet etched, such as for example, silicon on glass (SOG).

Then, a mask layer M may be formed on the mold layer MO and an etching process may be performed so as to form a through hole H1 which secures a region where the cylinder type storage node 8 will be formed. In this case, the etching process may be excessively performed so that the insulating layer 3 exposed by the through hole H1 under the mold layer MO may be etched to a predetermined depth d while the through hole H1 is formed. Then, the exposed region of the insulating layer 3 may be recessed so that the recess region R having the width w and the depth d may be formed around the upper portion (hatched region) of the storage node contact plug 4.

The above excessive etching process for forming the recess region R may be performed by using, for example, an etch selectivity between the storage node contact plug 4 and the insulating layer 3. For example, the storage node contact plug 4 may be formed of conductive polysilicon or a metal material such as tungsten or a conductive nitride of the metal, and the insulating layer 3 is formed of a silicon oxide layer or a silicon nitride layer, and then, the required etch selectivity may be ensured through a plasma dry etching process using halogen gas, which is well known in the art.

Figure 2B:
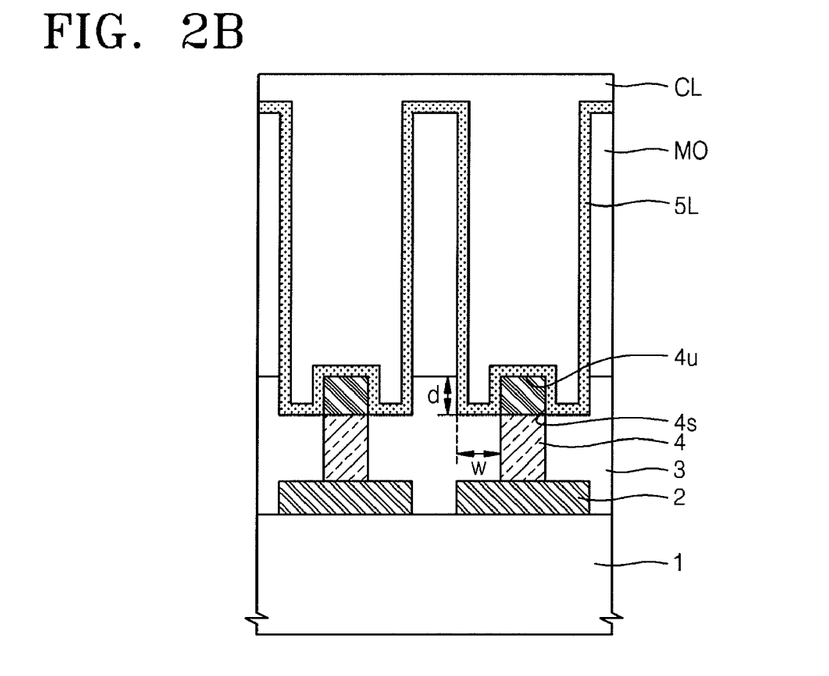

Referring to FIG. 2B, the mask layer M formed on the mold layer MO is removed, and then, a conductive layer 5L for forming the lower electrode may be formed on an inner wall of the through hole H1, the recess region R of the insulating layer 3, and exposed surfaces 4u and 4s of the storage node contact plug 4. The conductive layer 5L for forming the lower electrode 5 may be deposited using, for example, a chemical vapour deposition (CVD) method or an atomic layer deposition (ALD) method. The conductive layer 5L for forming the lower electrode 5 may be formed of a metal such as, for example, tungsten (W) or titanium (Ti), or a conductive nitride material thereof.

In some embodiments, the conductive layer 5L for forming the lower electrode 5 may include, for example, hemisphere-shaped grain (HSG), quantum dots, or micro crystals to increase a surface area thereof, as well known in the art. Accordingly, the surface of the lower electrode 5 may have an unsmooth surface morphology.

In some embodiments, a sacrificial layer CL such as, for example, plasma enhanced tetraethyl orthosilicate (PE-TEOS) and boron-phospho-silicate glass (BPSG) having beneficial gap-fill properties may be formed on the conductive layer 5L to fill the through hole H1, and to protect the conductive layer 5L formed in the through hole H1 from a subsequent process of removing the mold layer MO.

Figure 2C:
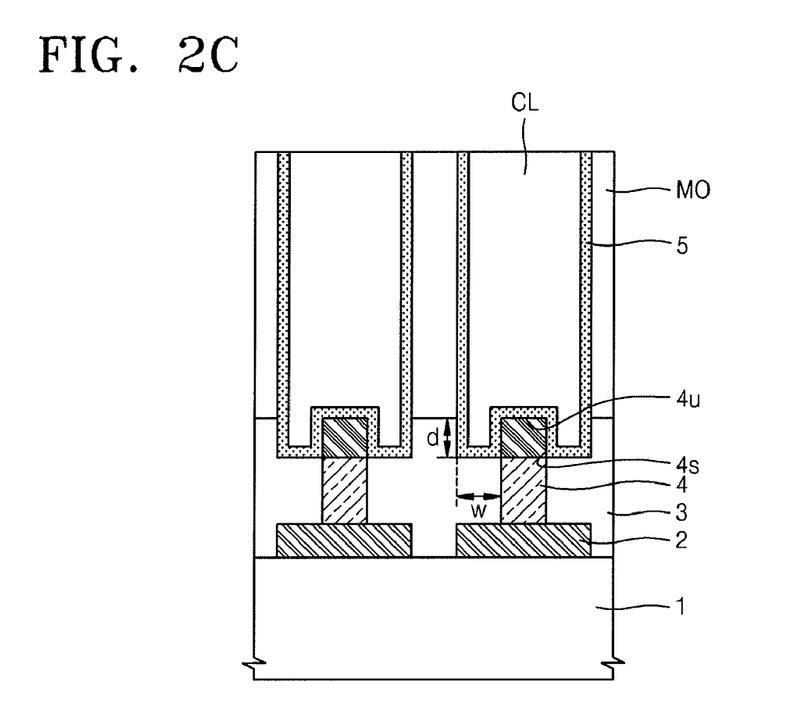
Figure 2D:
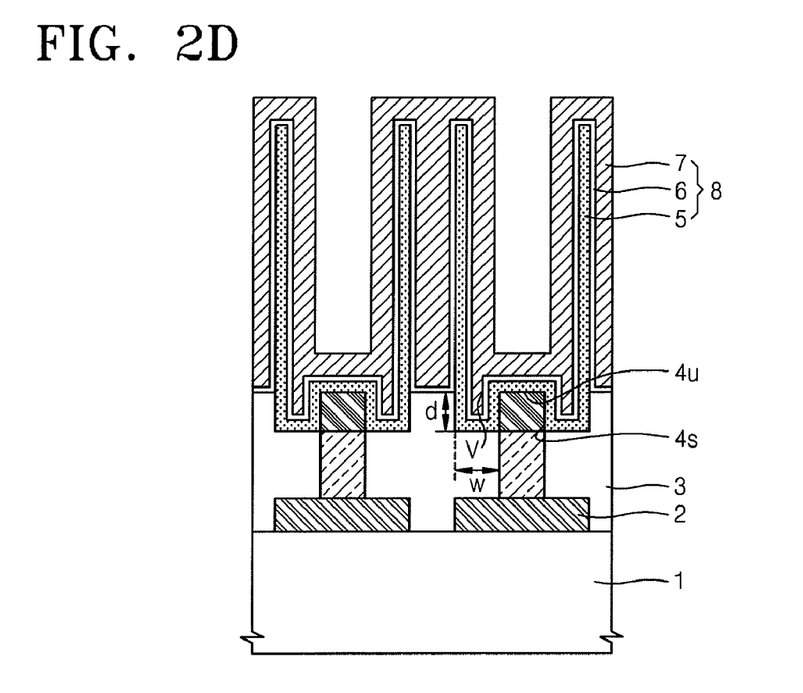

Referring to FIG. 2C, the sacrificial layer CL and the conductive layer 5L may be removed until the upper surface of the mold layer MO is exposed by, for example, an etch-back process or a chemical mechanical polish (CMP) process, and accordingly, lower electrodes 5 which may be separated and isolated from each other are formed. Then, referring to FIG. 2D, the mold layer MO and the sacrificial layer CL may be removed by, for example, a wet-etching process using, for example, a hydrofluoric acid solution, and then, the dielectric layer 6 and the upper electrode 7 may be sequentially formed on the exposed lower electrodes 6 to complete the cylinder type storage node 8.

In some embodiments, the dielectric layer 6 of the cylinder type storage node 8 may be a silicon oxide layer. In addition, the dielectric layer 6 may further include one or more high-k layers to increase the capacitance. The high-k layer may include one of a silicon nitride layer, a hafnium oxide layer, a zirconium oxide layer, a tantalum oxide layer, a titanium oxide layer, a hafnium-aluminium oxide layer, a hafnium-tantalum oxide layer, a hafnium-silicon oxide layer, an aluminium oxide layer, an aluminium nitride layer, an aluminium-gallium nitride layer, and mixtures thereof. However, the embodiments of the present invention are not limited to the above examples. Then, as shown in FIG. 1, an interlayer dielectric 9 may be formed on the cylinder type storage node 8 to form a semiconductor memory device 10.

Figure 3A:
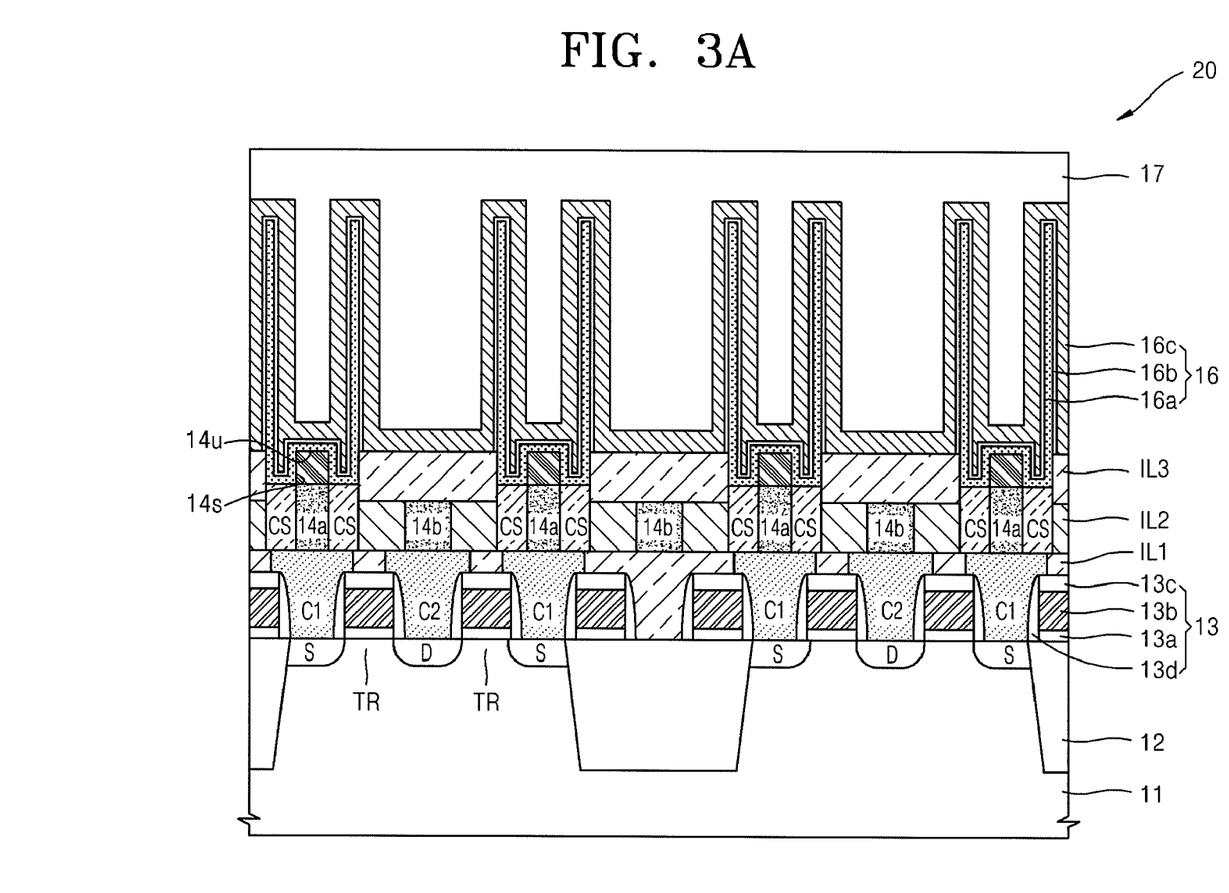
FIGS. 3A and 3B are cross-sectional views of a semiconductor memory device according to an exemplary embodiment of the present invention.
Figure 3B:
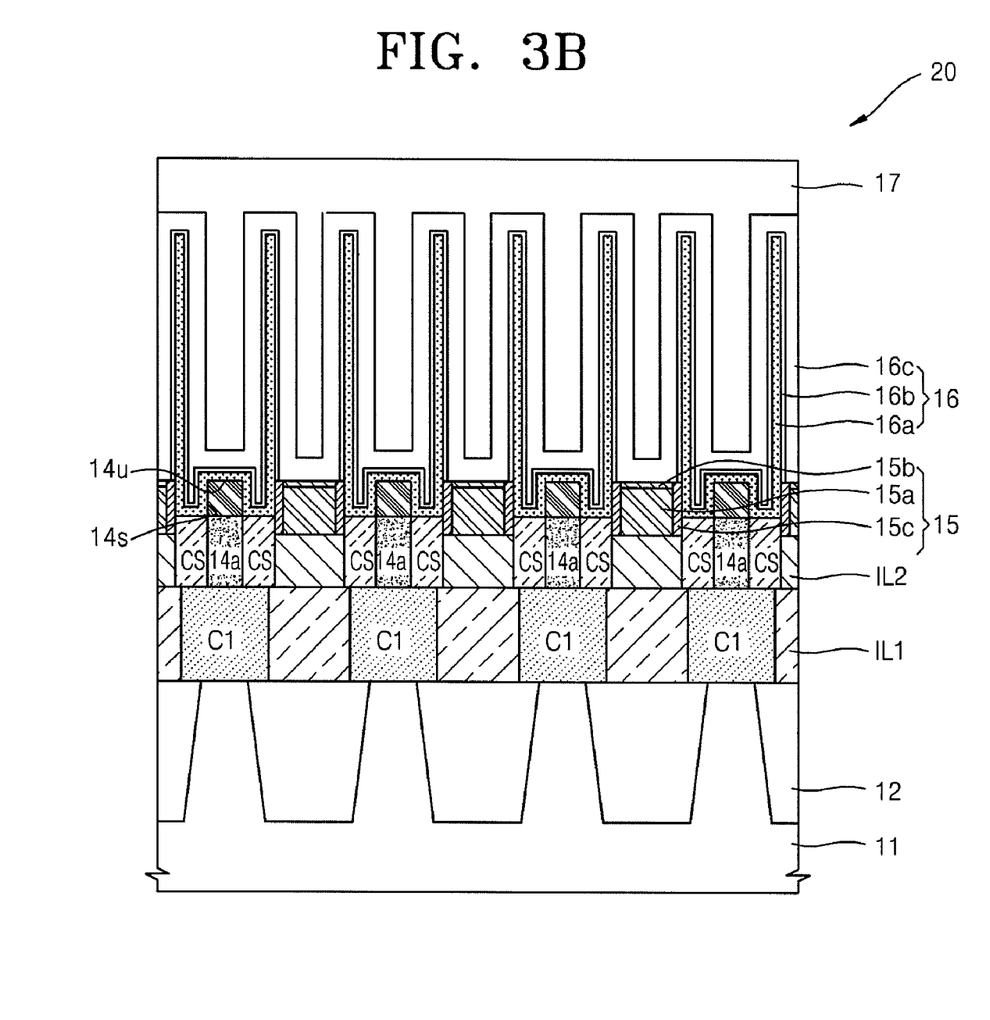

FIGS. 3A and 3B are cross-sectional views illustrating a semiconductor memory device 20 according to another exemplary embodiment of the present invention. FIG. 3A shows a cross-section of the semiconductor memory device 20 perpendicular to the direction of word lines 13, and FIG. 3B shows a cross-section of the semiconductor memory device 20 perpendicular to the direction of bit lines 15. The semiconductor memory device 20 has a similar structure to a COB structure as a cylinder type storage node 16 is formed over the bit lines 15. However, the structure of the semiconductor memory device 20 is different from the general COB structure in that a bottom surface of a lower electrode 16a of the cylinder type storage node 16 is below the uppermost surface of the bit lines 15.

Referring to FIGS. 3A and 3B, the semiconductor memory device 20 may include appropriate lower structures on a semiconductor substrate 11, for example, field effect transistors TR which are switching devices and buried landing pads C1 and C2. However, embodiments of the present invention are not limited to the above examples. For example, a graphene device or a nano-device may be used as the switching device instead of using the field effect transistor, and two or more transistors may be coupled to one cylinder type storage node 16. In addition, the buried landing pads C1 and C2 may be omitted when a storage node contact plug 14a which will be described later or the bit lines 15 are directly connected to source/drain regions S and D of the field effect transistors TR, or other buried vias may be further formed.

For forming the lower structures, a device isolation layer 12 such as, for example, a shallow trench isolation (STI) may be formed in the semiconductor substrate 11 to define active regions. Next, an oxide layer, a gate conductive layer and an insulating layer are sequentially deposited on the semiconductor substrate 11 and patterned to form gate stacks each including a gate insulating layer 13a, a gate electrode 13b, and a capping layer 13c. The gate insulating layer 13a may be, for example, a thermal oxide layer, and the gate electrode 13b may include, for example, a conductive polysilicon layer, a tungsten silicide layer, or a stacked structure thereof. The capping layer 13c may include, for example, a silicon nitride layer.

Then, the gate stack may be used as an ion implantation mask to form the source drain regions S and D in the active regions of the semiconductor substrate 11. Subsequently, a gate spacer 13d may be formed on a side wall of the gate stack to complete the word line 13.

Then, an insulating layer may be deposited on the semiconductor substrate 13, on which the word lines 13 are formed, and, for example, a photolithography process and an etching process are performed to form a first interlayer dielectric IL1 and, then, form the storage node landing pads C1 and the bit line landing pads C2 respectively on the source and drain regions S and D.

In other embodiments, the storage node landing pads C1 and the bit line landing pads C2 may be formed using, for example, a self-aligned process unlike the embodiment illustrated in FIGS. 3A and 3B. For example, to perform the self-aligned process, an etch stop layer which is formed of a thin nitride layer may be formed on the word lines 13. In this case, the process of forming the first interlayer dielectric IL1 may not be performed.

After forming the landing pads C1 and C2, a second interlayer dielectric IL2 may be formed. Then, via holes which expose the bit line landing pads C2 may be formed in the second interlayer dielectric IL2, and the via holes may be filled with a conductive layer and a planarization process may be formed to form buried contacts 14b for bit lines.

Hereinafter, subsequent processes for forming the storage node contact plug 14a and the cylinder type storage node 16 will be described with reference to FIGS. 4A through 4H, besides FIGS. 3A and 3B.

Figure 4A:
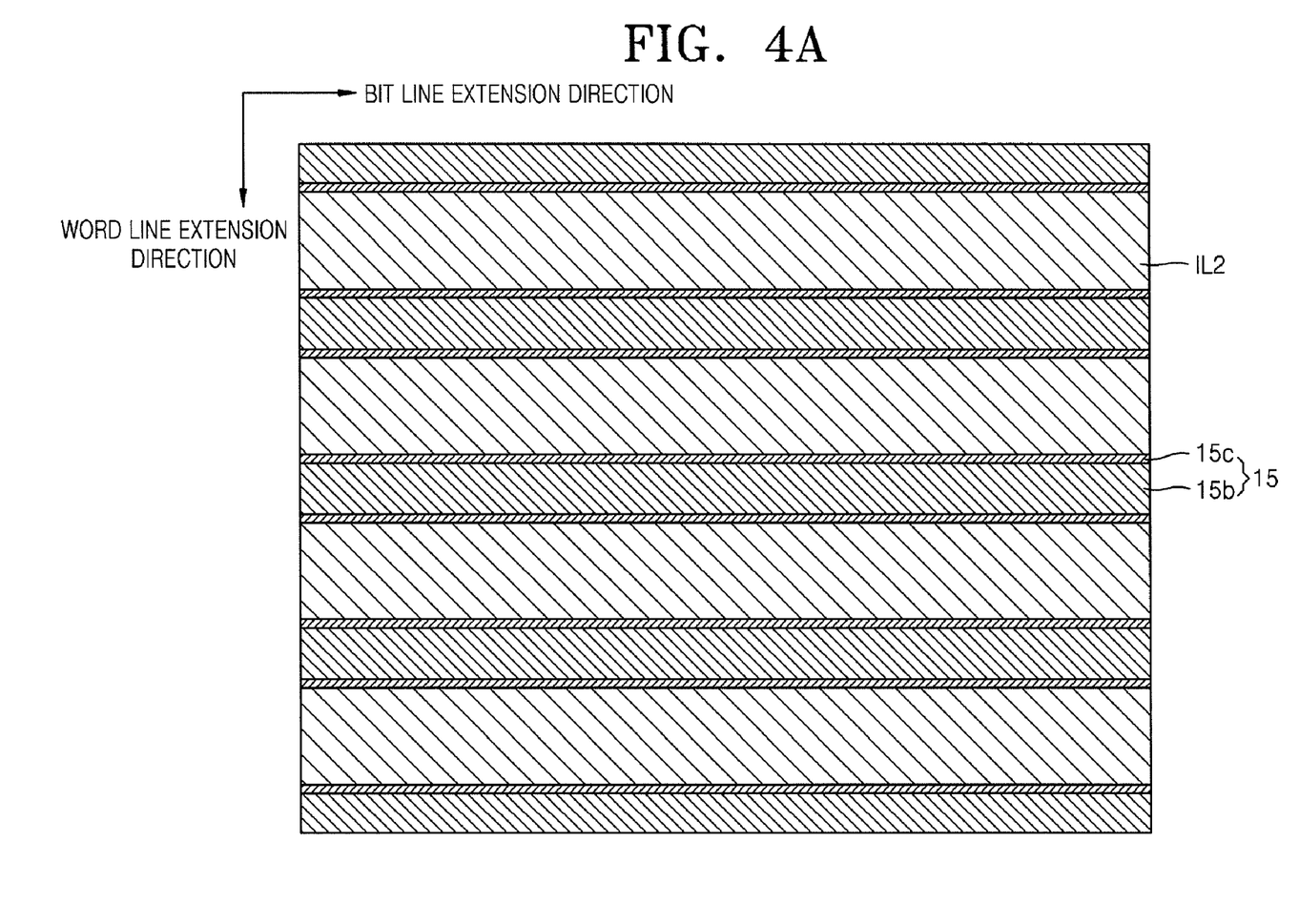
FIGS. 4A through 4H are plan views illustrating processes of fabricating a storage node contact plug and a cylinder type storage node illustrated in FIGS. 3A and 3B.

Referring to FIG. 4A, the bit lines 15 may be formed on the second interlayer dielectric IL2. The bit lines 15 may be formed by depositing, for example, a tungsten layer, a tungsten silicide layer, or a titanium nitride layer and patterning the deposited layer. The bit lines 15 may be disposed on the device isolation layer 12 of the semiconductor substrate 11, and may be electrically connected to the buried contacts 14b. In some embodiments, after forming the via holes in the second interlayer dielectric IL2, the via holes may be filled with the conductive layer for bit lines, and thus, the process of forming the buried contacts 14b for bit lines may be omitted.

In some embodiments, each of the bit lines 15 may further include a capping layer 15b which has an etch selectivity with respect to a third interlayer dielectric IL3 which will be described later. For example, when the third interlayer dielectric IL3 is a silicon oxide layer, the capping layer 15b may be formed of a silicon nitride layer. In addition, each of the bit lines 15 may further include bit line spacer layers 15c on side walls thereof. The bit line spacer layer 15c has an etch selectivity with respect to a contact plug spacer layer SC which will be described later to protect the bit lines.

Figure 4B:
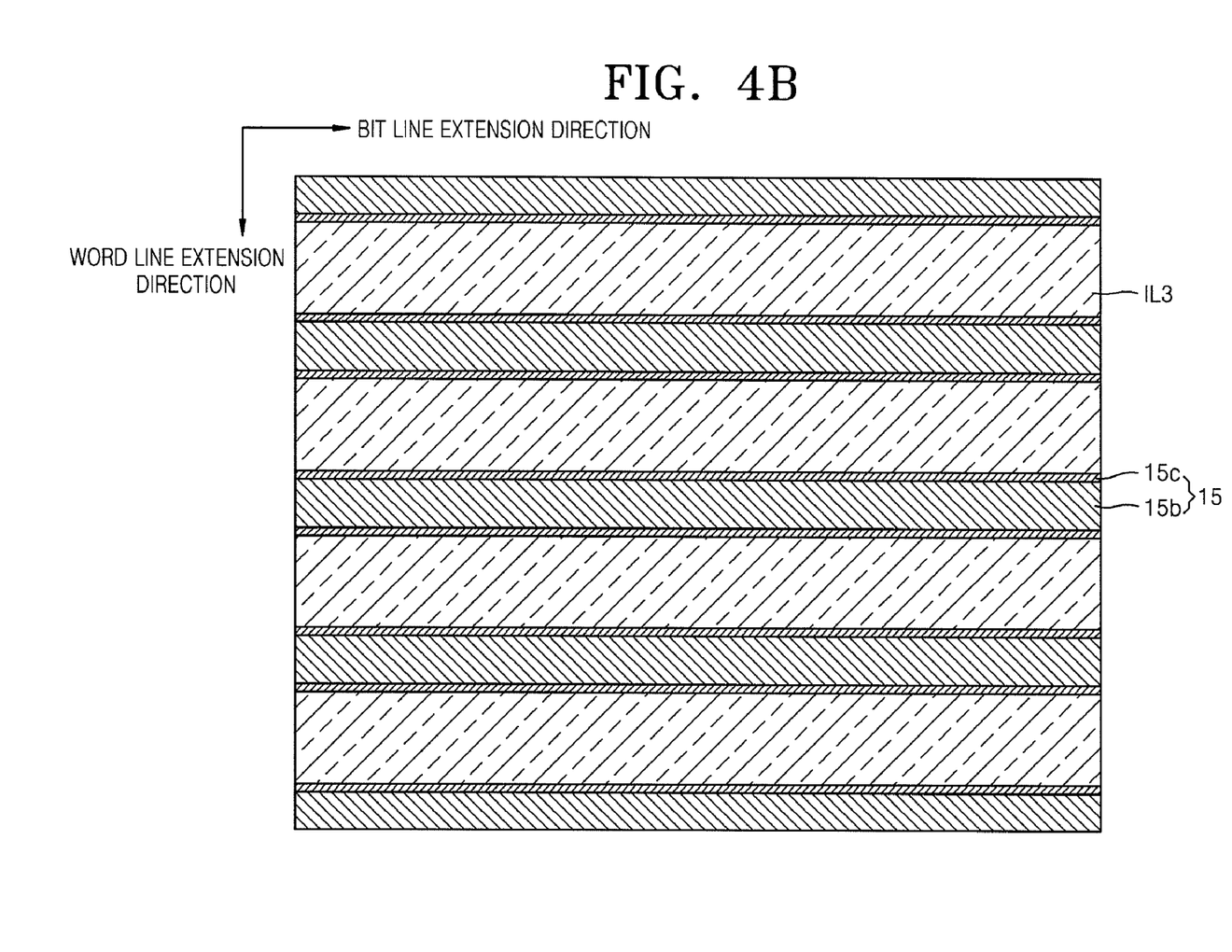

Referring to FIG. 4B, the third interlayer dielectric IL3 may be formed between the bit lines 15 so as to fill spaces between the bit lines 15. In some embodiments, a silicon oxide layer, for example, may be deposited on the semiconductor substrate 11, on which the bit lines 15 are formed, and the planarization process may be performed using an etchback method or a CMP method until surfaces of the capping layers 15b in the bit lines 15 are exposed. Thus, the third interlayer dielectric IL3 may be formed at the same height as those of the bit lines 15.

Figure 4C:
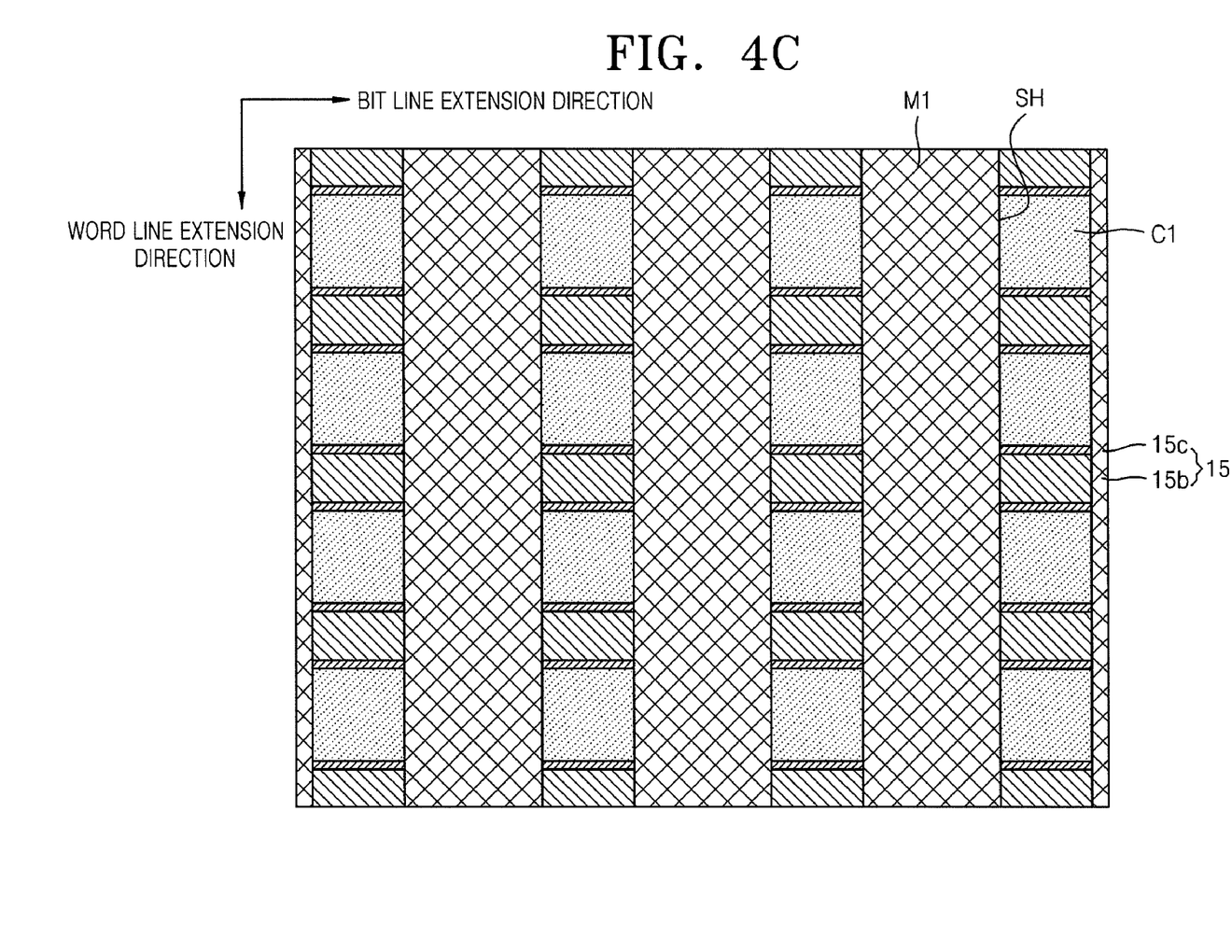

Referring to FIG. 4C, a mask layer M1 having line patterns may be formed on the semiconductor substrate 11, on which the third interlayer dielectric IL3 is formed, for forming opening regions SH which expose surfaces of the storage landing pads C1. The mark layer M1 may be a hard mask. The underlying third interlayer dielectric IL3 and second interlayer dielectric IL2 may be removed using the mask layer M1 as an etching mask until the surfaces of the storage node landing pads C1 are exposed, and then, the opening regions SH may be formed.

Figure 4D:
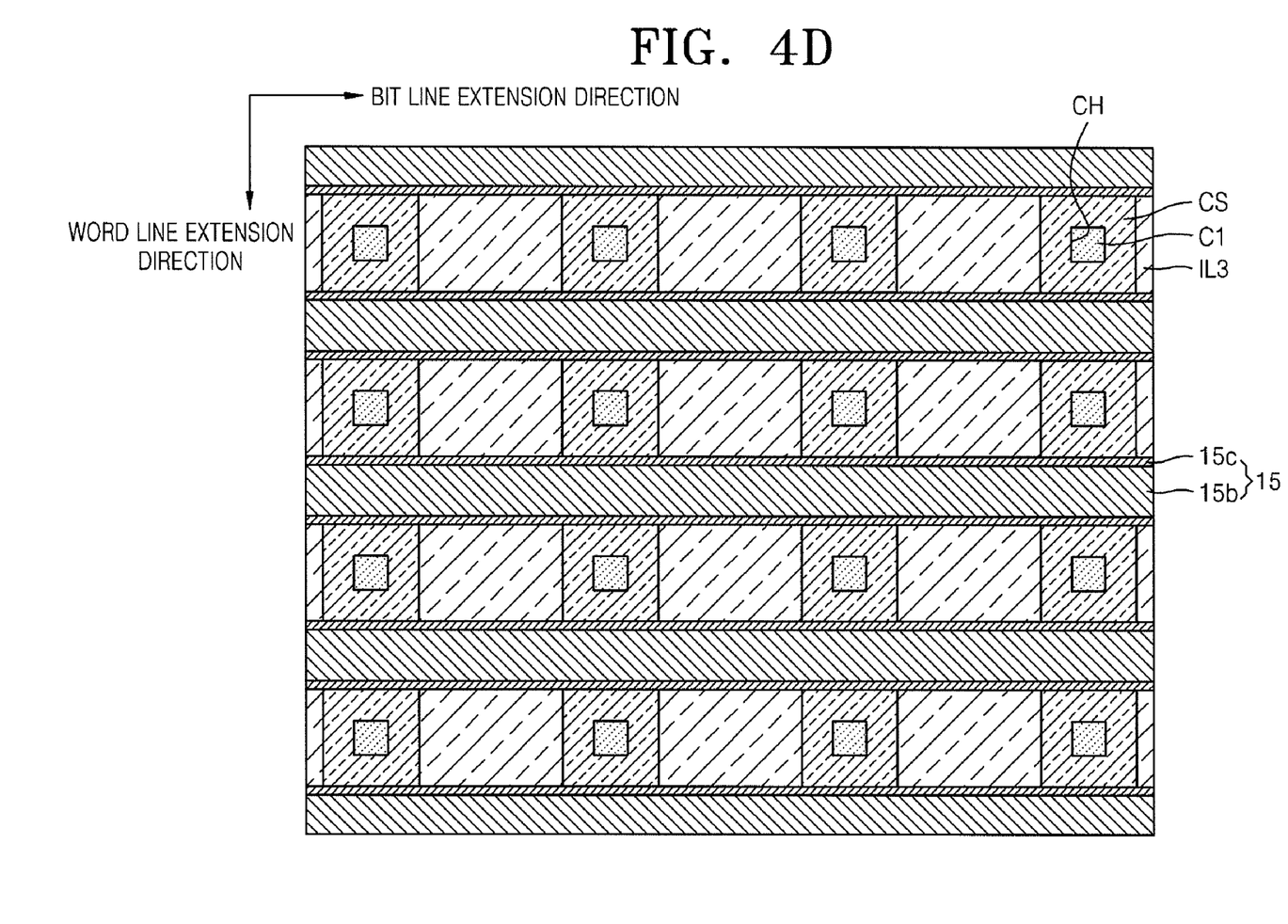

Referring to FIG. 4D, the mask layer M1 may be removed, and the contact plug spacer layers CS may be formed on side walls of the opening regions SH. The contact plug spacer layers CS may be formed of a material having a high etch selectivity with respect to the storage node contact plug 14a to form the recess region (refer to R of FIG. 2A), which will be described later.

In some embodiments, the thickness of the contact plug spacer layer CS may be large enough for the inner walls of the dielectric layer 16b deposited on the lower electrode 16a of the cylinder type storage node 16 to define the void region (refer to V of FIG. 1) adjacent to the exposed side surface 14s of the storage node contact plug 14a. For example, as shown in FIG. 1, the thickness of the contact plug spacer layer CS may be greater than twice the sum of those of lower electrode 16a and the dielectric layer 16b. The void region V may increase the capacitance by increasing the electrode area of the cylinder type storage node 16.

Figure 4E:
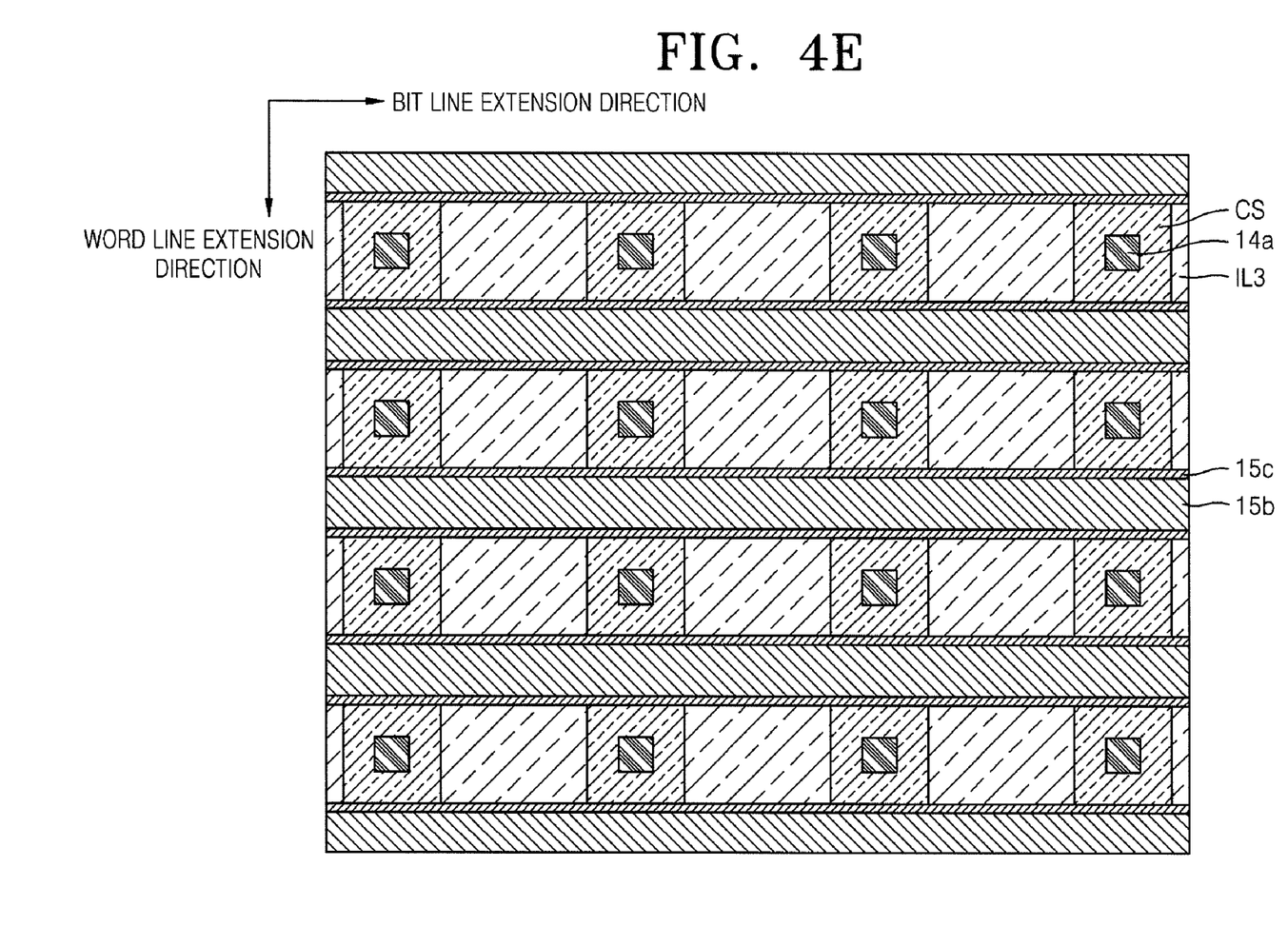

Referring to FIG. 4E, a conductive layer formed of, for example, conductive polysilicon or a metal such as, for example, tungsten or a conductive nitride material of a metal may be formed on the semiconductor substrate 11, on which the contact plug spacer layers CS are formed, so as to fill holes CH which are defined by the contact plug spacer layers CS. Then, an etch-back process or a CMP process of the conductive layer may be performed until the third interlayer dielectric IL3 and the surfaces of the bit lines 15 are exposed, and thus, the storage node contact plugs 14a which are separated from each other may be formed. According to the embodiments of the present invention, the storage node contact plugs 14a may be self-aligned along a direction perpendicular to the bit lines 15 by the contact plug spacer layers CS.

Figure 4F:
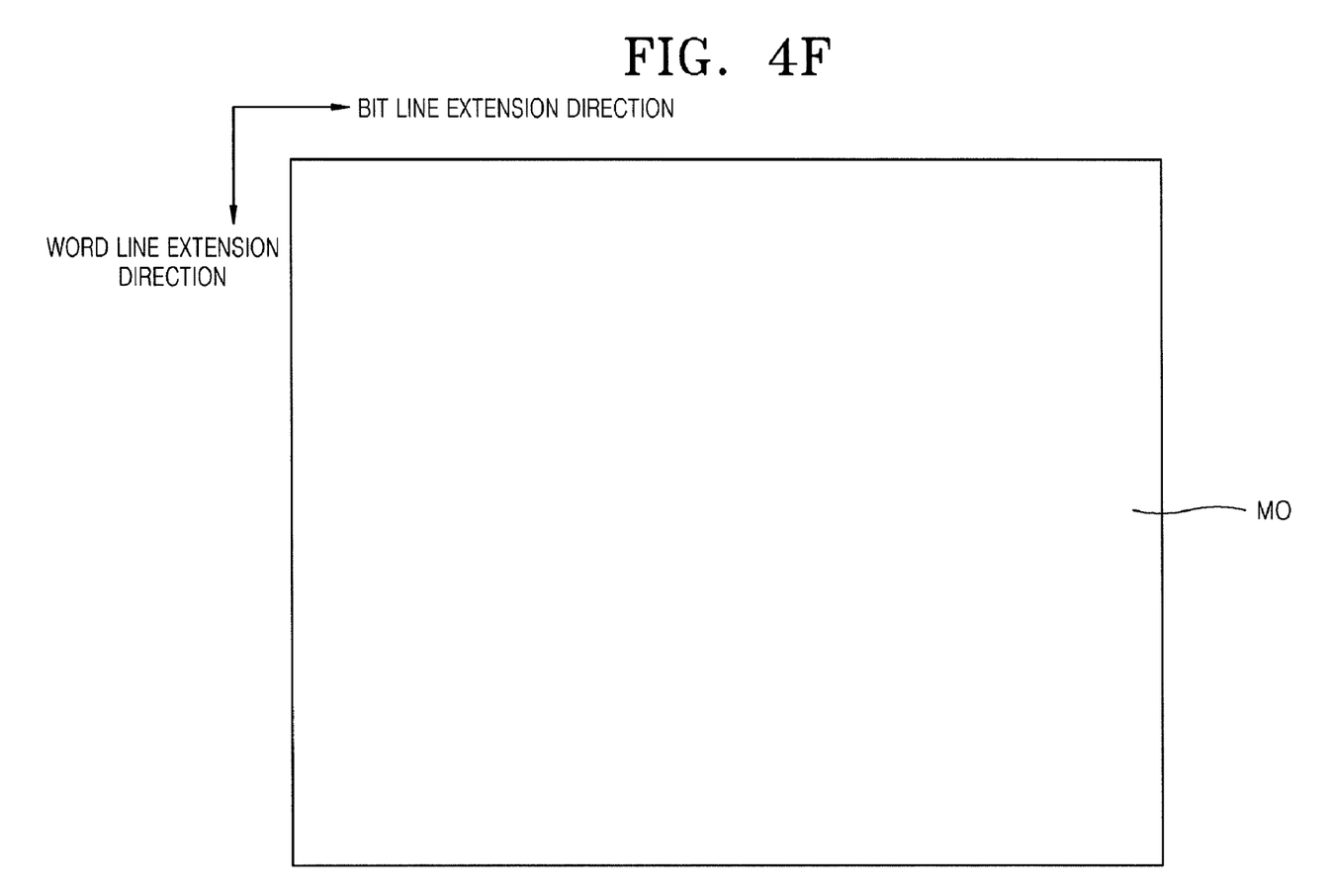

Referring to FIG. 4F, a mold layer MO may be formed to a height of the cylinder type storage node 16 which will be later formed on the semiconductor substrate 11 with the storage node contact plugs 14a. The mold layer MO may be formed of, for example, a silicon oxide layer which may be readily wet-etched, such as for example, a silicon on glass (SOG).

Figure 4G:
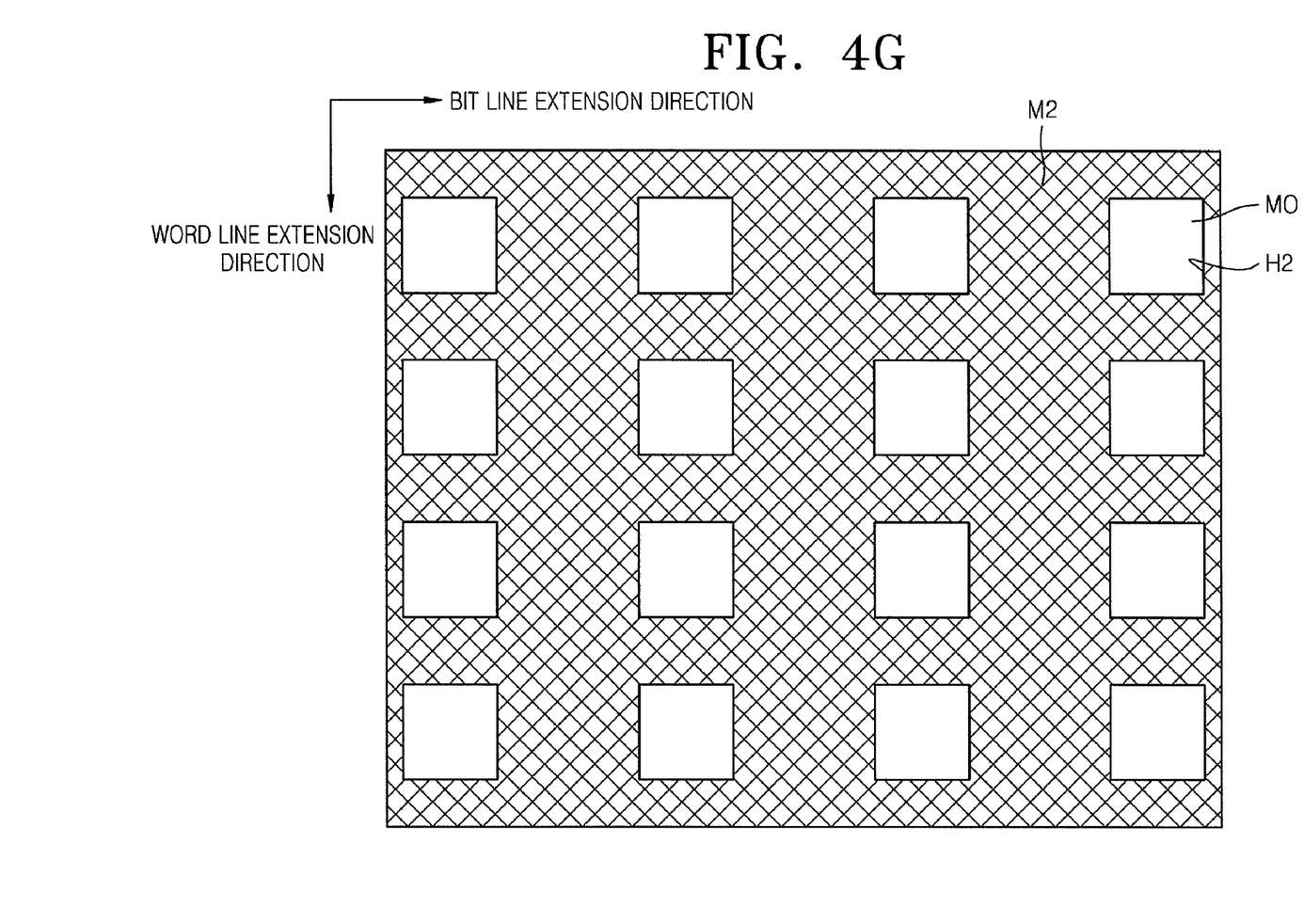
Figure 4H:
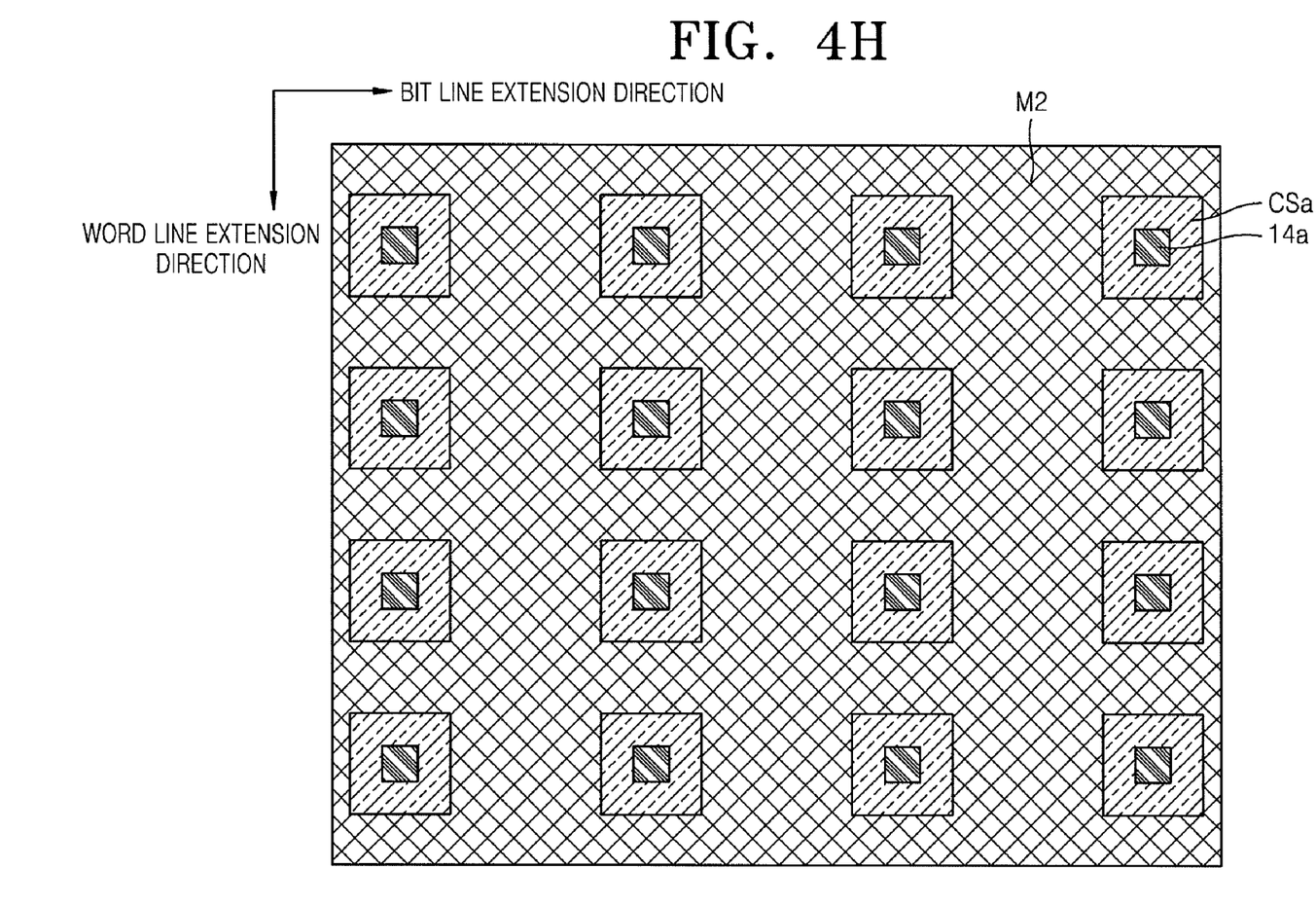

Referring to FIG. 4G, a mask layer M2, which define through holes H2 for defining regions where the cylinder type storage node 16 will be later formed, is formed on the mold layer MO. Then, for example, as shown in FIG. 4H, an etching process may be performed to form the through holes H2 by using the mask layer M2 as an etching mask. The etching process may be performed to excessively etch the contact plug spacer layers CS, which are exposed by the through holes H2, under the mold layer MO to a predetermined depth. Regions CSa denoted by hatched lines denote upper surfaces of the contact plug spacer layers CS which are excessively etched. Thus, as described above with reference to FIG. 2A, the recess regions (refer to R of FIG. 2A) each having a predetermined width and depth are formed around the storage node contact plugs 14a from the recessed contact plug spacer layers CS.

As shown in FIG. 4G, the through holes H2 may be squared-shaped. However, the embodiments of the present invention are not limited to the above example. For example, the through hole H2 may have, for example, an oval shape or a lozenge shape with a major axis of which is parallel to the bit lines, a circle shape in consideration of a miss-alignment margin of the photolithography process.

The excessive etching process of the contact plug spacer layers CS for forming the recess regions R may be performed using an etch selectivity between the storage node contact plug 14a and the contact plug spacer layer CS. For example, the storage node contact plug 14a may be formed of the conductive polysilicon, or the metal such as tungsten or the conductive nitride material of the metal, and the contact plug spacer layer CS may be formed of the silicon oxide layer or the silicon nitride layer, and then, the required etch selectivity may be ensured through the plasma dry etching process using the halogen-containing gas, which is well known in the art.

Then, as described above with reference to FIG. 2B, the mask layer M2 formed on the mold layer MO is removed, and then, the conductive layer 5L for forming lower electrode may be deposited on inner walls of the through holes H2 formed in the mold layer MO, the recessed upper surfaces CSa of the contact plug spacer layers CS, and the exposed surfaces 4u and 4s of the storage node contact plugs 14a. The conductive layer 5L may be formed of a metal such as, for example, W or Ti, or a conductive nitride material thereof.

In some embodiments, the conductive layer 5L for forming the lower electrode 5 may include, for example, the hemisphere-shaped grains (HSG), quantum dots, or micro crystals to increase a surface area thereof, and accordingly, the surface of the lower electrode 5 may have an unsmooth surface morphology.

In some embodiments, the sacrificial layer CL such as, for example, PE-TEOS or BPSG having beneficial gap-fill properties may be formed on the conductive layer 5L to fill the through holes H2 so that the conductive layer 5L formed in the through holes H2 may not be etched in subsequent processes. Next, as described above with reference to FIG. 2C, an etch-back process or a CMP process may be performed to form the lower electrodes 16a which are separated from each other.

Consequently, the mold layer MO and the sacrificial layer CL may be removed, and the dielectric layer 16b and the upper electrode 16c are sequentially formed on the exposed lower electrode 16a to form the cylinder type storage node 16. In some embodiments, the dielectric layer 16b may be, for example, the silicon oxide layer. Also, the dielectric layer 16b may include, for example, one or more high-k layers to increase the capacitance. Then, as shown in FIGS. 3A and 3B, the interlayer dielectric 17 may be formed on the cylinder type storage node 16, and then, the semiconductor memory device 20 is completed.

Referring to FIGS. 3A and 3B again, the upper portions (hatched regions) of the storage node contact plug 14a are exposed by the contact plug spacer layers CS which are recessed to have a predetermined width and a predetermined depth. That is, the upper portions of the storage node contact plugs 14a may be separated from the third interlayer dielectric IL3 and the bit lines 15 as much as a thickness of the contact plug spacer layer CS and protrude over the contact plug spacer layers CS as high as the recessed depth of the contact plug spacer layer CS. Therefore, the lower electrode 16a of the cylinder type storage node 16 may contact the exposed upper and side surfaces 14u and 14s of the storage node contact plug 14a.

According to the embodiments of the present invention, the cylinder type storage node of the present invention may ensure stronger mechanical stability than that of the conventional cylinder type storage node which is supported only by the upper surface of the storage node contact plug. In addition, in view of the electrical performance, the contact area between the storage node contact plug 14a and the lower electrode 16a increases so that the contact resistance may decrease, and parasitic capacitance generated by the bit line and adjacent insulating layer may be reduced by the void region V. Accordingly, as an RC delay effect may be reduced or suppressed, the cylinder type storage node of embodiments of the present invention may be suitable for highly integrated and high speed memory devices.

In addition, according to the embodiments of the present invention, the exposed upper portion of the storage node contact plug 14a passes through between the bit lines 15, and thus, at least a portion of the outer wall of the lower electrode 16a of the cylinder type storage node 16 may be mechanically supported due to the contact with the side surfaces of the bit lines 15. In addition, at least a portion of the outer wall of the lower electrode 16a may be supported by the side surface of the third interlayer dielectric IL3 which may be formed between the bit lines 15, and accordingly, a strong mechanical stability may be ensured.

According to the embodiments of the present invention, as shown in FIG. 4G, when the mask layer M2 to define the through holes H2 is formed on the interlayer dielectric, at least a portion of the lower electrode 16a of the cylinder type storage node 16 may be attached to the exposed side wall of the storage contact plug 14a even when the mask layer M2 is miss-aligned, and thus, beneficial mechanical support may be still ensured between the storage node contact plugs 14a and the lower electrodes 16a.

The present invention includes the above mentioned embodiments and other various embodiments including but not limited to the following embodiments.

1) A method of fabricating a semiconductor memory device including cylinder type storage nodes is provided. The method includes forming switching devices on a semiconductor substrate, forming an insulating layer on the switching devices and forming storage node contact plugs in the insulating layer. The storage node contact plugs are electrically connected to the switching devices. In addition, the method further includes recessing a portion of the insulating layer around the storage node contact plugs so as to expose at least some portions of upper surfaces and side surfaces of the storage node contact plugs and forming lower electrodes of the cylinder type storage nodes so that the lower electrodes contact at least some portions of the exposed uppers and side surfaces of the storage node contact plugs.

2) A method according to above 1), wherein after forming the lower electrodes of the cylinder type storage nodes, the method further includes: stacking a dielectric layer on the lower electrodes, and wherein an inner wall of the dielectric layer defines void regions around the exposed side surfaces of the storage contact plugs is provided.

3) A method of fabricating a semiconductor memory device including cylinder type storage nodes is provided. The method includes forming transistors on a semiconductor substrate, forming bit lines, which are electrically connected to drains of the transistors, on the semiconductor substrate. The method further includes forming an insulating layer filling spaces between the bit lines, forming opening regions for electrically connecting to sources of the transistors in the insulating layer, forming contact plug spacer layers on side walls of the opening regions for defining holes, forming storage node contact plugs which are filled in the holes; forming a mold layer on the semiconductor layer, forming through holes in the mold layer for exposing the contact plug spacer layers and the storage node contact plugs,, recessing the contact plug spacer layers which are exposed through the through holes so as to expose upper surfaces and at least some portions of side surfaces of the storage node contact plugs and forming lower electrodes contacting the exposed upper and at least some portions of the side surfaces of the storage node contact plugs.

4) A method according to above 3), wherein the exposing of the upper surfaces and at least some portions of the storage node contact plugs includes excessively etching the exposed contact plug spacer layers next to the forming of the through holes is provided.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor memory device comprising:
a semiconductor substrate including transistors;
bit lines formed on the semiconductor substrate and electrically connected to drains of the transistors;
a first insulating layer formed between the bit lines and including storage node contact plugs therein, wherein the storage node contact plugs are electrically connected to sources of the transistors and the first insulating layer is recessed so as to expose at least some portions of upper surfaces and side surfaces of the storage node contact plugs; and
cylinder type storage nodes each having a lower electrode which contacts at least a portion of the exposed upper surfaces and side surfaces of the storage node contact plugs.

2. The semiconductor memory device of claim 1, wherein the first insulating layer includes first spacer layers which are formed on side walls of the bit lines.

3. The semiconductor memory device of claim 2, wherein the storage node contact plugs are self-aligned between the bit lines by the first spacer layers.

4. The semiconductor memory device of claim 1, wherein the bit lines include bit line conductive layers and second spacer layers formed on side walls of the bit line conductive layers, and the first spacer layers and the second spacer layers have an etch selectivity therebetween.

5. The semiconductor memory device of claim 1, wherein at least a portion of the lower electrode of each of the cylinder type storage nodes is supported by a contact with the side wall of the bit lines.

6. The semiconductor memory device of claim 1, wherein at least a portion of the lower electrode of each of the cylinder type storage nodes is supported by a contact with a side wall of a second insulating layer formed between the bit lines.

7. The semiconductor memory device of claim 1, wherein a shape of a bottom portion of the cylinder type storage nodes is determined on the basis of a miss-alignment margin in a photolithography process.

8. The semiconductor device of claim 1, further comprising a device isolation layer formed in the semiconductor substrate to define active regions, and wherein the bit lines are disposed on the device isolation layer of the semiconductor substrate.

9. The semiconductor device of claim 1, wherein the cylinder type storage nodes further include a dielectric layer and an upper electrode sequentially formed on the lower electrode.

10. The semiconductor device of claim 2, wherein the first spacer layers are formed of one of a silicon oxide layer and a silicon nitride layer.

11. The semiconductor device of claim 1, further comprising an interlayer dielectric layer formed on the cylinder type storage nodes.

* * * * *